(12) United States Patent
Gektin et al.

(10) Patent No.: US 7,301,227 B1
(45) Date of Patent: Nov. 27, 2007

(54) PACKAGE LID OR HEAT SPREADER FOR MICROPROCESSOR PACKAGES

(75) Inventors: Vadim Gektin, San Jose, CA (US); Deviprasad Malladi, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 122 days.

(21) Appl. No.: 11/207,630

(22) Filed: Aug. 19, 2005

(51) Int. Cl.
*H01L 23/02* (2006.01)
*H01L 23/48* (2006.01)

(52) U.S. Cl. .............. 257/680; 257/692; 257/E23.061; 257/E23.081

(58) Field of Classification Search .............. 257/680, 257/692, E23.081, E23.061
See application file for complete search history.

(56) References Cited

U.S. PATENT DOCUMENTS

| | | | |
|---|---|---|---|
| 5,723,904 A | * | 3/1998 | Shiga ..................... 257/698 |
| 6,724,080 B1 | * | 4/2004 | Ooi et al. ................ 257/704 |
| 7,084,010 B1 | * | 8/2006 | Kennedy et al. ........... 438/115 |
| 2004/0251044 A1 | * | 12/2004 | Choi et al. ............... 174/52.4 |
| 2005/0253254 A1 | * | 11/2005 | Neogi et al. ............. 257/723 |

* cited by examiner

*Primary Examiner*—Ngân V. Ngô
(74) *Attorney, Agent, or Firm*—Martine Penilla & Gencarella, LLP

(57) ABSTRACT

A package for an integrated circuit (IC) die comprises a substrate and a lid. The substrate has an upper surface facing an interior of the package and a lower surface facing an exterior of the package. The upper surface of the substrate carries an IC die and provides electrical connections from the IC die to the lower surface of the substrate. The lid includes an outer lid and an inner lid. The inner lid is positioned over the IC die and is in thermal communication with the IC die. The inner lid is formed of a material suitable for conducting heat away from the IC die. The outer lid is attached to the upper surface of the substrate. A gap extends between the outer lid and inner lid.

20 Claims, 4 Drawing Sheets

PACKAGE LID OR HEAT SPREADER FOR MICROPROCESSOR PACKAGES

BACKGROUND

An integrated circuit (IC) die is typically packaged between a substrate and a lid. The substrate provides electrical connections between each of the contact pads of the IC die and external connections of the package. Furthermore, many packages are also required to efficiently conduct heat from the IC die to the outside of the package, primarily through the package lid, which in many cases also acts as a heat spreader.

Current state of the art in package design of lidded packages include in-plane single material lids with or without a cavity. Sometimes, cavity shaped lids are constructed out of two or more materials, however even in these cases, the horizontal plate portion is constructed out of a single material. Single material construction provides mechanical integrity, manufacturing simplicity, and low cost. However, as a result, there exists a thermo-mechanical problem when attaching a single material lid to a package with a large silicon die that generates significant heat.

FIG. 1 shows an exemplary existing package assembly 100. Assembly 100 includes package 110 mounted to circuit board 104 via socket 102. Package 110, which is shown in more detail in FIG. 2, includes substrate 112, IC die 114, and lid 116. Socket 102 is optional as some assemblies have package 110 soldered directly to circuit board 104. Package 110, socket 102, and circuit board 104 are sandwiched between heat sink 108 and bolster plate 109. Heat sink 108 receives heat from package 110 and dissipates the heat into the ambient. Bolts 120 apply a force via springs 122 to package 110 thereby ensuring good electrical contact between substrate 112 and circuit board 104 via socket 102. Other mechanical connections are known as well.

An electrically powered fan (not shown) may also be provided to provide enhanced airflow across heat sink 108 to further increase heat dissipation. In some systems, in place of heat sink 108 may be a heat exchanger having circulating fluid, a heat pipe, or other means for removing heat from package 110. The term, "heat sink" as used herein will refer to any such heat removal device.

Heat passes from IC die 114 to lid 116 via a thermally conductive adhesive 124, which is bonded to both IC die 114 and lid 116 to provide a continuous heat path. Heat then passes from lid 116 to heat sink 108 by way of a thermal transfer compound 126 or other thermal medium. Lid 116 is attached to substrate 112 by adhesive 118 or other connecting means.

Lid 116 is required to have good thermal conductivity, and is also required to be sufficiently strong to withstand the forces applied by bolts 120 and springs 122. Depending on the requirements, the pressure exerted on lid 116 could be as high as 300 pounds per square inch and higher. Such pressures are necessary, e.g., to ensure good electrical connection between contact lands 121 on substrate 112 and corresponding ones (not shown) on socket 102. To accommodate strength and thermal conductivity requirements, prior art lids were therefore typically made of metals or ceramic materials (AlSiC) with good thermal conductivity and strength properties.

However, a problem with materials having good thermal conductivity and strength has been an inevitable mismatch in the coefficient of thermal expansion (CTE) between lid 116 and other components. This is because thermally advanced materials having high thermal conductivity have, as a byproduct of their construction, a low CTE, and hence, a resulting thermo-mechanical mismatch with high CTE substrate and low CTE silicon die, thus creating a contradiction between thermal and reliability requirements.

For example, the silicon IC die may have a coefficient of thermal expansion of 2.5 $(10-6)/°$ C. whereas the lid may have a coefficient of, for example, from 6 $(10-6)/°$ C. to 17 $(10-6)/°$ C. This difference results in relative movement between lid 116 and IC die 114, which can result in delamination of thermally conductive adhesive 124. This delamination represents a thermal break, which can significantly reduce the conductivity of the thermal path within package 110. The risk of delamination is increased with newer IC dies such as multi-core processors with large caches, which have a large surface area and greater power dissipation.

A need therefore exists to provide an IC die package that reliably provides an unimpeded thermal path for heat to flow from the IC die to the exterior of the package.

SUMMARY

Broadly speaking, the present invention fills these needs by providing a package having a composite lid.

It should be appreciated that the present invention can be implemented in numerous ways, including as a process, an apparatus, a system, a device, or a method. Several inventive embodiments of the present invention are described below.

In one embodiment, a package for an IC die comprises a substrate and a lid. The substrate has an upper surface facing an interior of the package and a lower surface facing an exterior of the package. The upper surface of the substrate carries an IC die and provides electrical connections from the IC die to the lower surface of the substrate. The lid includes an outer lid and an inner lid. The inner lid is positioned over the IC die and is in thermal communication with the IC die. The inner lid is formed of a material suitable for conducting heat away from the IC die. The outer lid is attached to the upper surface of the substrate. A gap extends between the outer lid and inner lid.

In another embodiment, a composite lid for a package for an IC die comprises an outer lid and an inner lid. The outer lid is ring shaped. The inner lid is positioned within a central opening of the outer lid and is sized relative to the central opening such that a gap exits in an annular region between the inner lid and the outer lid. The inner lid is centrally positioned for thermal coupling with the IC die, the inner lid being formed of a material suitable for conducting heat away from the IC die. The outer lid has a downwardly extending outer rim for attaching to the upper surface of a substrate.

In yet another embodiment, a package for an IC die includes a substrate and a lid. The substrate has an upper surface facing an interior of the package and a lower surface facing an exterior of the package. The upper surface carries an IC die, the substrate providing electrical connections from the IC die to the lower surface of the substrate on the exterior of the package. The outer lid is ring shaped and the inner lid is positioned within a central opening of the outer lid such that the inner lid is positioned over the IC die and is thermally coupled with the IC die. The inner lid is formed of a material suitable for conducting heat away from the IC die. The outer lid is attached to the upper surface of the substrate. The outer lid and inner lid are separated by a gap, the gap being an annular region between the inner lid and the outer lid.

The advantages of the present invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION

Reference will now be made in detail to specific embodiments of the invention. While the invention will be described in conjunction with specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention, which may be practiced without some or all of these specific details. The drawings are presented for illustrative purposes only and are not intended to be to scale or otherwise denote specific relative dimensions.

Figure 1:
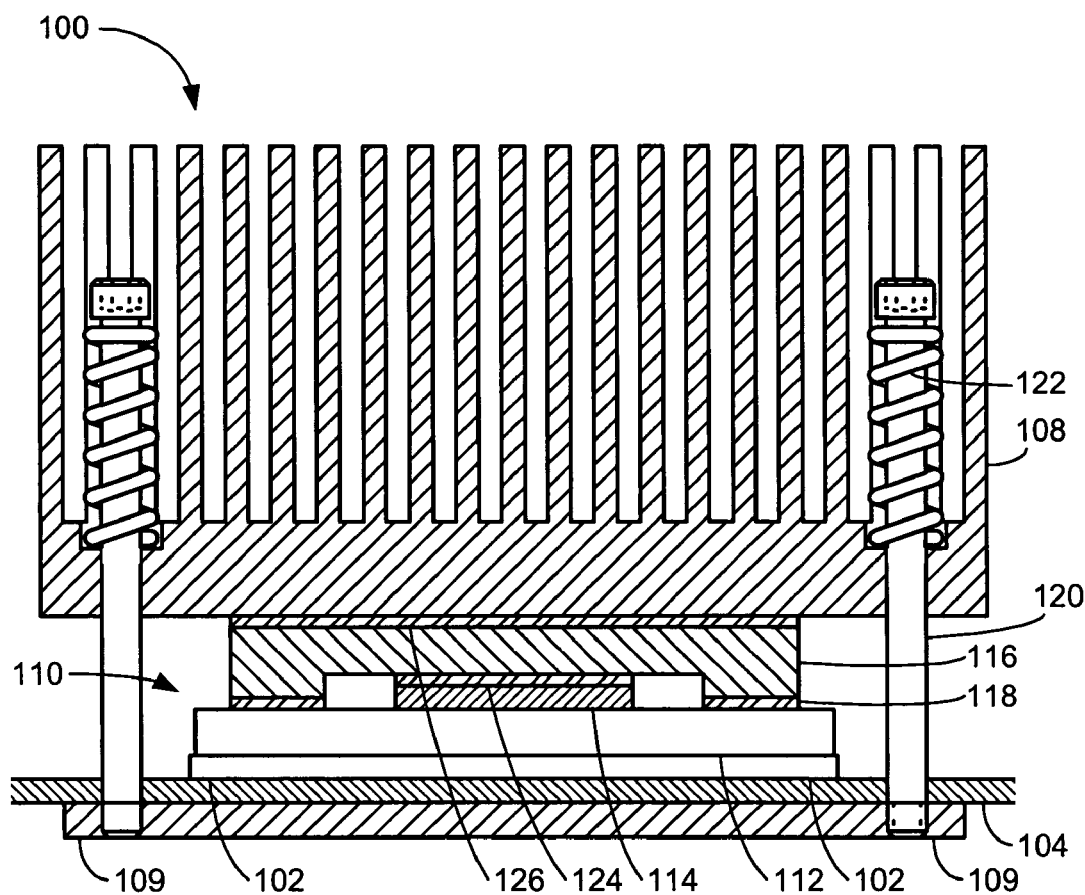
FIG. 1 shows an cross-section elevation view of a prior art package assembly.
Figure 2:
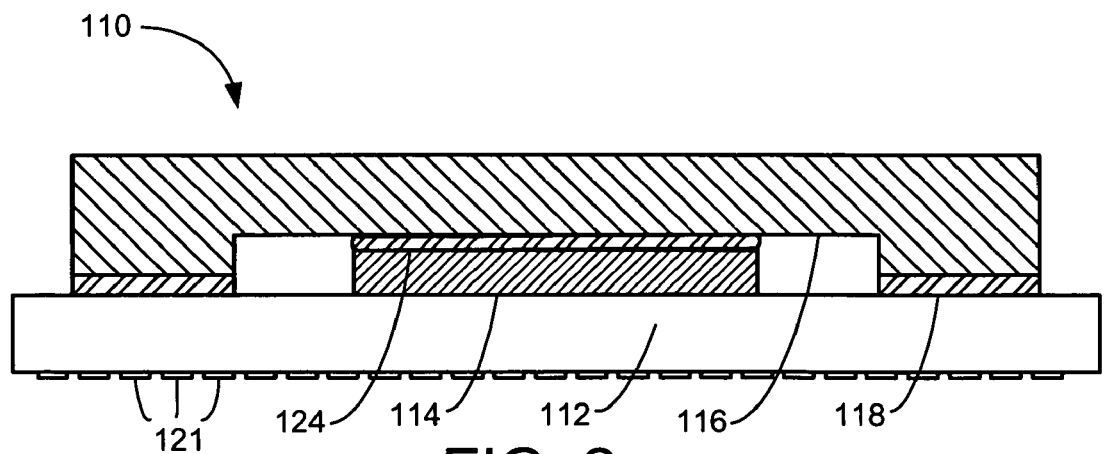
FIG. 2 shows a detail cross-section of a prior art package shown in FIG. 1.
Figure 3:
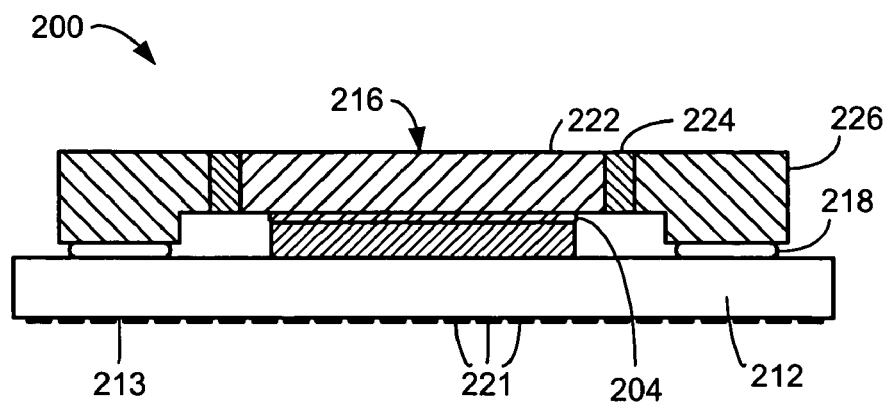
FIG. 3 shows an elevation view in partial cross-section of an exemplary IC die package having a composite lid construction.
Figure 4:
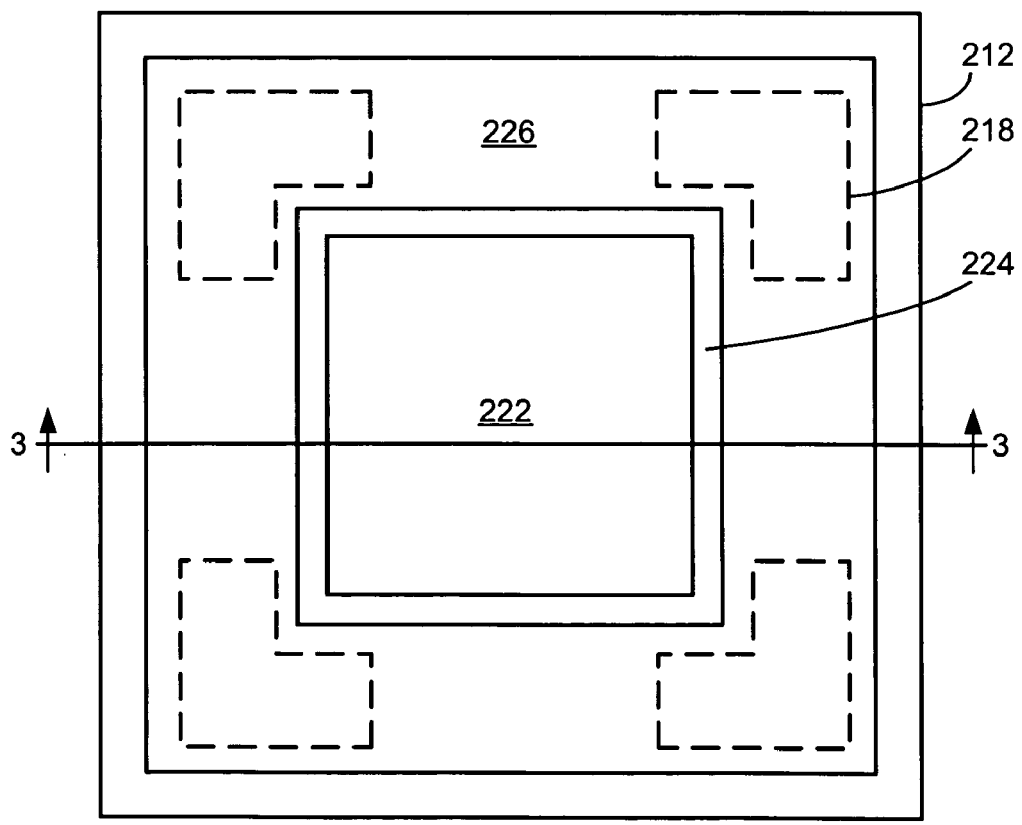
FIG. 4 shows a plan view of the IC die package shown in FIG. 3.

FIG. 3 shows a cross-section view of exemplary IC die package 200 having a composite lid 216, with the section taken along line 3-3 in FIG. 4, which shows a plan view of IC die package 200. IC die package 200 comprises a substrate 212 formed of, for example, an organic material or a ceramic material. The substrate provides electrical pathways (not shown) to connect contact pads formed on IC die 202 to contact lands (not shown) on the bottom 213 of substrate 212. In place of lands, balls or pins may be provided for directly soldering to a circuit board or for insertion into a socket, such as a zero insertion force (ZIF) socket.

Composite lid 216 is formed from an inner lid 222 and an outer lid 226 and is connected by a compliant intermediary 224. Outer lid 226 is generally formed into a ring shape and is attached by adhesive 218 at its lower side to substrate 212. Outer lid is formed of a material that is sufficiently strong to transfer a majority of the force applied by the heat sink attachment means to substrate 212, to insure good electrical connection between electrical contacts in the substrate and counterpart contacts on the circuit board or socket. Furthermore, outer lid 226 should have a coefficient of thermal expansion (CTE) that closely matches the CTE of substrate 212. For example, the material may be a copper-tungsten alloy.

Inner lid 222 is positioned over IC die 202 and is primarily responsible for conducting heat away from IC die 202 along its thickness dimension. Both inner lid 222 and outer lid 226 may be machined after package assembly to ensure a flat surface across both. The higher the thermal conductivity of inner lid 222, the thicker inner lid 222 may be. Inner lid 222 may have a larger surface area and therefore extend beyond the perimeter of IC die 202 so that inner lid 222 can perform some heat spreading function, particularly if inner lid 222 is relatively thick. Inner lid is formed from a material having a CTE that closely matches the CTE of IC die 202. Since inner lid 222 is not required to be particularly strong, it may be made of copper or other highly heat conducting material such as a diamond composite.

Outer lid 226 and inner lid 222 are dimensioned such that there is an annular gap between them. In one embodiment, composite lid 216 includes a compliant material 224 positioned in the annular gap between inner lid 222 and outer lid 226. Compliant material 224 may be formed of polyurethane or other rubberized material having strong adhesion properties and that is thermally stable at operating temperatures. There are many suitable materials having these qualities.

To manufacture composite lid 216, outer lid and inner lid may be positioned on a template and compliant material 224 applied in an uncured state with a squeegee or like applicator. Excess material may then be wiped away and the compliant material cured, e.g., by the application of moisture or ultra-violet light. After curing, any remaining excess material may be removed using a cutting tool, abrasion, or both. Other manufacturing methods may of course occur to those skilled in the art.

Outer lid 226 is attached to substrate 212 by adhesive 218. Adhesive 218 is shown in FIG. 4 as being applied in the four corner regions of substrate 212. However, other application patterns are possible. For example, adhesive 218 may be applied along two opposite sides on the upper surface of substrate 212. The particular pattern used is not critical. Thermally conductive adhesive 204 might be applied to the upper surface of IC die 202 or lower surface of inner lid 222 prior to fixing composite lid 216 to substrate 212. Outer lid 226 and inner lid 222 are pressed flat to compress adhesive 218 and thermally conductive adhesive 204 such that outer lid 226 and inner lid 222 are coplanar. As an optional final step, the upper surface of lid 216 may be abraded to further planarize the upper surface and/or remove any remaining excess compliant material 224.

Figure 5:
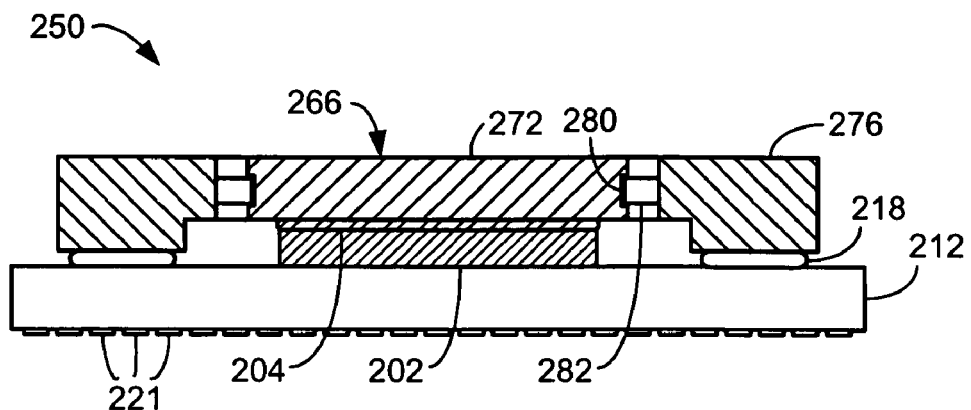
FIG. 5 shows an elevation view in partial cross-section of another exemplary IC die package having a composite lid construction.
Figure 6:
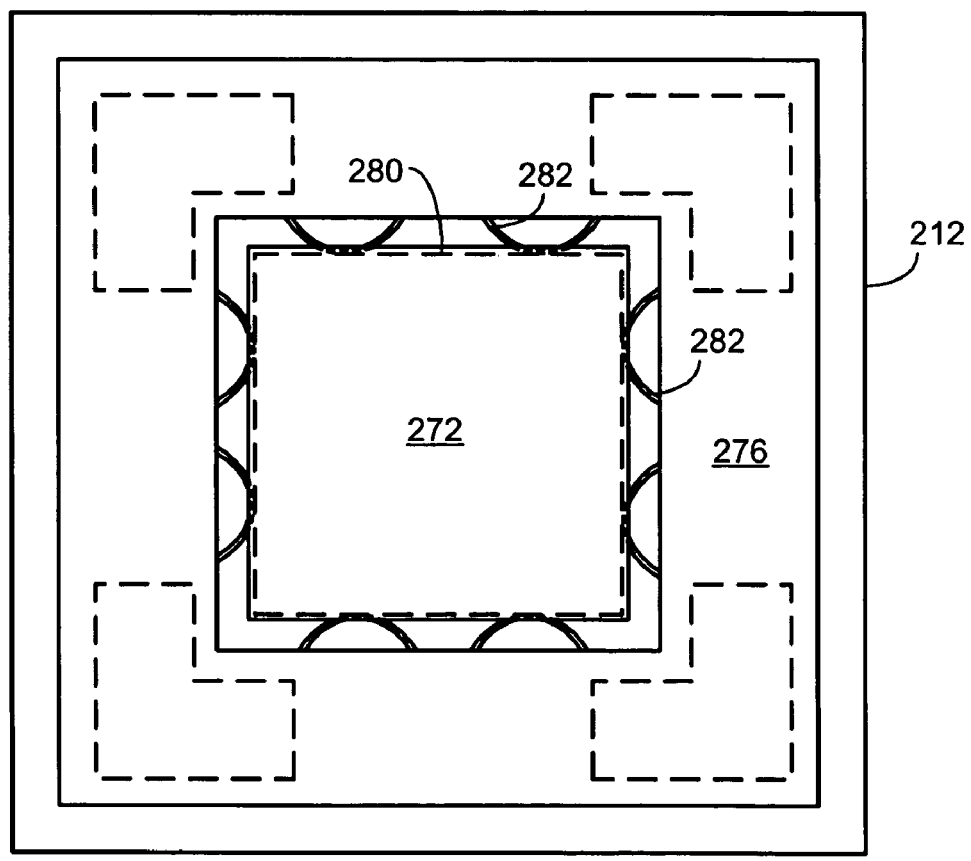
FIG. 6 shows a plan view of the IC die package shown in FIG. 5.
Figure 7:
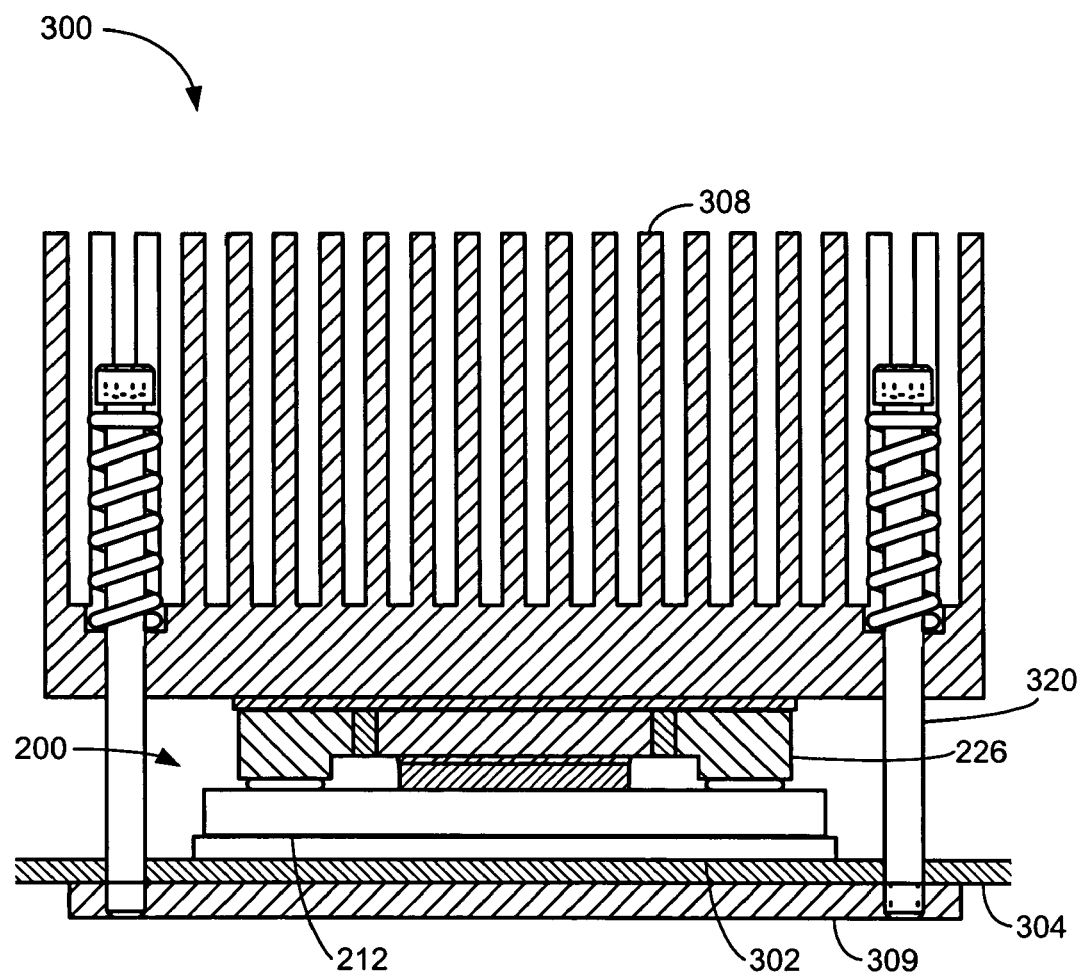
FIG. 7 shows the integrated circuit package of FIGS. 3 and 4 mounted to a circuit board with a heat sink.

Another exemplary embodiment is presented in FIGS. 5 and 6. In this embodiment, springs 282 are used in place of a compliant material. Springs 282 are shown as extending in looped fashion from outer lid 276 and engaging groove 280 formed in the outer edge of inner lid 272. Springs 282 may be variously shaped, as would occur to those skilled in the art. It should be recognized that springs 282 may extend from inner lid 272 to engage a groove in outer lid 276 rather than the reverse as shown. Springs 282 may be integrally formed with outer lid 276 (or inner lid 272) or may be attached using adhesive or other known means. If not integrally formed, springs 282 may be formed of a metal wire, injection-molded plastic, or other material. Eight springs are shown, but any number of springs may be used, e.g., four springs. The annular gap between inner lid 272 and outer lid 276 must be large enough to accommodate springs 282, but need not be very large. To connect the inner and outer lids, a pyramid-shaped part may be placed over inner lid 272, and outer lid pushed down, the pyramid causing springs to compress until they reach groove 282.

It is possible that outer and inner lids may be designed such that the gap extends only partially around the inner lid. In this case, inner lid 272 may abut inner edges of outer lid 276 and one or more springs retain inner lid 272 and allow for relative expansion and contraction of the two parts.

As with the previous embodiment, outer lid 276 is formed from a strong material having a CTE closely matching the CTE of substrate 212 and inner lid 272 is formed from a highly heat conductive material having a CTE closely matching the CTE of IC die 202.

Although the foregoing invention has been described in some detail for purposes of clarity of understanding, it will be apparent that certain changes and modifications may be practiced within the scope of the appended claims. For example, it is possible to form the package with simply an air space between the outer and inner lids. Furthermore, while the inner lid has been shown with a square shape, other shapes, such as circles, etc., are also possible. Accordingly, the present embodiments are to be considered as illustrative and not restrictive, and the invention is not to be limited to the details given herein, but may be modified within the scope and equivalents of the appended claims.

What is claimed is:

1. A package for an integrated circuit (IC) die, the package comprising:
   a substrate, the substrate having an upper surface facing an interior of the package and a lower surface facing an exterior of the package, the upper surface carrying an IC die, the substrate providing electrical connections from the IC die to the lower surface of the substrate on the exterior of the package;
   a lid, the lid comprising an outer lid and an inner lid, the inner lid being positioned over the IC die and in thermal communication with the IC die, the inner lid being formed of a material suitable for conducting heat away from the IC die, the outer lid being attached to the upper surface of the substrate; and
   wherein a gap extends between the outer lid and the inner lid, the inner lid and the outer lid being constructed and assembled so that the gap permits the inner lid to move with respect to the outer lid and accommodate differences in thermal expansion between the inner lid and the outer lid.

2. The package of claim 1, wherein the outer lid has a coefficient of thermal expansion (CTE) that closely matches a CTE of the substrate.

3. The package of claim 1, wherein the inner lid has a coefficient of thermal expansion (CTE) that closely matches a CTE of the IC die.

4. The package of claim 1, wherein the outer lid is attached to the upper surface of the substrate using an adhesive.

5. The package of claim 1, wherein the inner lid is attached to the IC die using a heat conductive adhesive material.

6. The package of claim 1, wherein the gap between the outer lid and the inner lid contains a compliant material, the compliant material being adhered to edges of the outer lid and the inner lid that face the gap.

7. The package of claim 1, wherein the outer lid is ring shaped and the inner lid is positioned within a central opening of the outer lid, the gap being an annular region between the inner lid and the outer lid.

8. The package of claim 7, wherein the gap between the outer lid and the inner lid contains a compliant material, the compliant material being adhered to edges of the outer lid and the inner lid that face the gap.

9. The package of claim 1, wherein the outer lid is ring shaped and the inner lid is positioned within a central opening of the outer lid, the gap extending at least partially around the inner lid, and furthermore, wherein the gap between the outer lid and the inner lid contains one or more springs for retaining the inner lid in the central opening of the outer lid.

10. A composite lid for a package for an IC die, the composite lid comprising:
    an outer lid, the outer lid being ring shaped;
    an inner lid, the inner lid being positioned within an opening of the outer lid, the inner lid being sized relative to the central opening such that a gap extends between the inner lid and the outer lid, the gap extending vertically from an exterior of the package to an interior space of the package; and
    wherein the inner lid is positioned for thermal coupling with the IC die, the inner lid being formed of a material distinct from a material of the outer lid, the material of the inner lid being suitable for conducting heat away from the IC die, the outer lid having a downwardly extending outer rim for attaching to an upper surface of the substrate.

11. The composite lid of claim 10, wherein the inner lid is formed from a material that has a coefficient of thermal expansion (CTE) that closely matches a CTE of the IC die.

12. The composite lid of claim 10, wherein the gap between the outer lid and inner lid contains a compliant material, the compliant material being adhered to edges of the outer lid and the inner lid that face the gap.

13. The composite lid of claim 12, wherein the gap comprises an annular region extending around the inner lid and the compliant material substantially fills the gap.

14. The composite lid of claim 10, wherein the gap between the outer lid and inner lid contains at least one spring for retaining the inner lid in the central opening of the outer lid.

15. A package for an IC die, the package comprising:
    a substrate, the substrate having an upper surface facing an interior of the package and a lower surface facing an exterior of the package, the upper surface carrying an IC die, the substrate providing electrical connections between the IC die and the lower surface of the substrate on the exterior of the package;
    a lid, the lid comprising an outer lid and an inner lid, the outer lid being ring shaped and the inner lid being positioned within a central opening of the outer lid such that the inner lid is positioned over the IC die and is thermally coupled with the IC die, the inner lid being formed of a material suitable for conducting heat away from the IC die, the outer lid being attached to the upper surface of the substrate; and
    wherein the outer lid and the inner lid are separated by a gap, the gap being an annular region between the inner lid and the outer lid, the inner lid and the outer lid being formed and assembled with the gap so that the inner lid is movable with respect to the outer lid.

16. The package of claim 15, wherein the outer lid has a coefficient of thermal expansion (CTE) that closely matches a CTE of the substrate.

17. The package of claim 15, wherein the inner lid has a coefficient of thermal expansion (CTE) that closely matches a CTE of the IC die.

18. The package of claim 15, wherein the outer lid is attached to the upper surface of the substrate using an adhesive.

19. The package of claim 15, wherein the inner lid is attached to the IC die using a heat conductive adhesive material.

20. The package of claim 15, wherein the gap between the outer lid and inner lid contains a compliant material, the compliant material being adhered to edges of the outer lid and inner lid facing the gap.

* * * * *